(12) United States Patent
Cheng

(10) Patent No.: US 12,320,755 B2
(45) Date of Patent: Jun. 3, 2025

(54) SYSTEM AND METHOD FOR DETECTING CONTAMINATION OF THIN-FILMS

(71) Applicant: Taiwan Semiconductor Manufacturing Co., Ltd., Hsinchu (TW)

(72) Inventor: Chung-Liang Cheng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 18 days.

(21) Appl. No.: 18/324,021

(22) Filed: May 25, 2023

(65) Prior Publication Data

US 2023/0296523 A1  Sep. 21, 2023

Related U.S. Application Data

(63) Continuation of application No. 17/169,101, filed on Feb. 5, 2021, now Pat. No. 11,686,683.

(Continued)

(51) Int. Cl.

| G01N 21/84 | (2006.01) |
|---|---|
| C23C 14/54 | (2006.01) |
| G01N 21/64 | (2006.01) |
| G01N 21/95 | (2006.01) |
| G06F 30/27 | (2020.01) |

(Continued)

(52) U.S. Cl.
CPC ....... *G01N 21/8422* (2013.01); *C23C 14/548* (2013.01); *G01N 21/6489* (2013.01); *G01N 21/9501* (2013.01); *G06F 30/27* (2020.01); *G06N 3/08* (2013.01); *G06V 10/145* (2022.01); *B82Y 30/00* (2013.01); *G01N 2021/6491* (2013.01)

(58) Field of Classification Search
CPC ........... G01N 21/8422; G01N 21/6489; G01N 21/9501; G01N 2021/6491; G06F 30/27; G06V 10/145; C23C 14/548; G06N 3/08; B82Y 30/00
USPC ......................................................... 356/300
See application file for complete search history.

(56) References Cited

U.S. PATENT DOCUMENTS

| 4,827,870 | A | | 5/1989 | Lee |
| 5,664,066 | A | * | 9/1997 | Sun ................. H01J 37/32935 |
| | | | | 706/31 |

(Continued)

FOREIGN PATENT DOCUMENTS

| CN | 102484041 A | 5/2012 |
| JP | H10212197 A | 8/1998 |

(Continued)

OTHER PUBLICATIONS

Dellis et al., "Broadband luminescence in defect-engineered electrochemicaly produced porous Si/ZnO nanostructures," *Scientific Reports* 8(1): 1-8, 2018.

*Primary Examiner* — Mohamed K Amara
*Assistant Examiner* — Omar H Nixon
(74) *Attorney, Agent, or Firm* — Seed IP Law Group

(57) ABSTRACT

A thin-film deposition system deposits a thin-film on a wafer. A radiation source irradiates the wafer with excitation light. An emissions sensor detects an emission spectrum from the wafer responsive to the excitation light. A machine learning based analysis model analyzes the spectrum and detects contamination of the thin-film based on the spectrum.

20 Claims, 13 Drawing Sheets

Related U.S. Application Data

(60) Provisional application No. 63/018,312, filed on Apr. 30, 2020.

(51) Int. Cl.
  *G06N 3/08* (2023.01)
  *G06V 10/145* (2022.01)
  *B82Y 30/00* (2011.01)

(56) References Cited

U.S. PATENT DOCUMENTS

| | | | |
|---|---|---|---|
| 5,707,500 A | 1/1998 | Shimamura et al. | |
| 5,963,315 A * | 10/1999 | Hiatt | H01L 21/67745 |
| | | | 356/237.3 |
| 6,483,585 B1 | 11/2002 | Yang | |
| 6,495,008 B2 | 12/2002 | Iijima et al. | |
| 7,079,975 B1 * | 7/2006 | Halliyal | G01B 11/0683 |
| | | | 702/172 |
| 2002/0173922 A1* | 11/2002 | Potyrailo | G01N 29/036 |
| | | | 702/39 |
| 2003/0021015 A1 | 1/2003 | Maier et al. | |
| 2003/0146109 A1 | 8/2003 | Sailor et al. | |
| 2005/0006590 A1 | 1/2005 | Harrison | |
| 2005/0196892 A1 | 9/2005 | Yamagata et al. | |
| 2009/0258134 A1 | 10/2009 | Lee et al. | |
| 2010/0018293 A1* | 1/2010 | Monkowski | G01M 3/202 |
| | | | 73/40.7 |
| 2010/0292950 A1 | 11/2010 | Iuchi et al. | |
| 2011/0117681 A1 | 5/2011 | Bardos et al. | |
| 2014/0203183 A1* | 7/2014 | Sando | H01J 19/58 |
| | | | 313/310 |
| 2016/0181134 A1* | 6/2016 | Budiarto | H01L 21/0332 |
| | | | 118/712 |
| 2017/0282214 A1 | 10/2017 | Stiff-Roberts et al. | |
| 2018/0010243 A1 | 1/2018 | Lee et al. | |
| 2020/0033820 A1* | 1/2020 | Furuya | G06N 20/00 |
| 2020/0341366 A1 | 10/2020 | Brouns et al. | |

FOREIGN PATENT DOCUMENTS

| | | | | |
|---|---|---|---|---|
| JP | H1161422 A | | 3/1999 | |
| JP | 2001133423 A | * | 5/2001 | |
| JP | 2001272342 A | | 10/2001 | |
| JP | 3663774 B2 | * | 6/2005 | |
| JP | 3986631 B2 | | 10/2007 | |
| TW | 464761 B | | 11/2001 | |
| TW | 201624108 A | | 7/2016 | |
| TW | 201935130 A | | 9/2019 | |
| WO | WO-2017079322 A1 | * | 5/2017 | G01B 11/06 |

* cited by examiner

SYSTEM AND METHOD FOR DETECTING CONTAMINATION OF THIN-FILMS

BACKGROUND

Technical Field

The present disclosure relates to the field of thin-film deposition.

Description of the Related Art

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

To continue decreasing the size of features in integrated circuits, various thin-film deposition techniques are implemented. These techniques can form very thin-films. However, thin-film deposition techniques also face serious difficulties in ensuring that the thin-films are properly formed.

DETAILED DESCRIPTION

Figure 1:
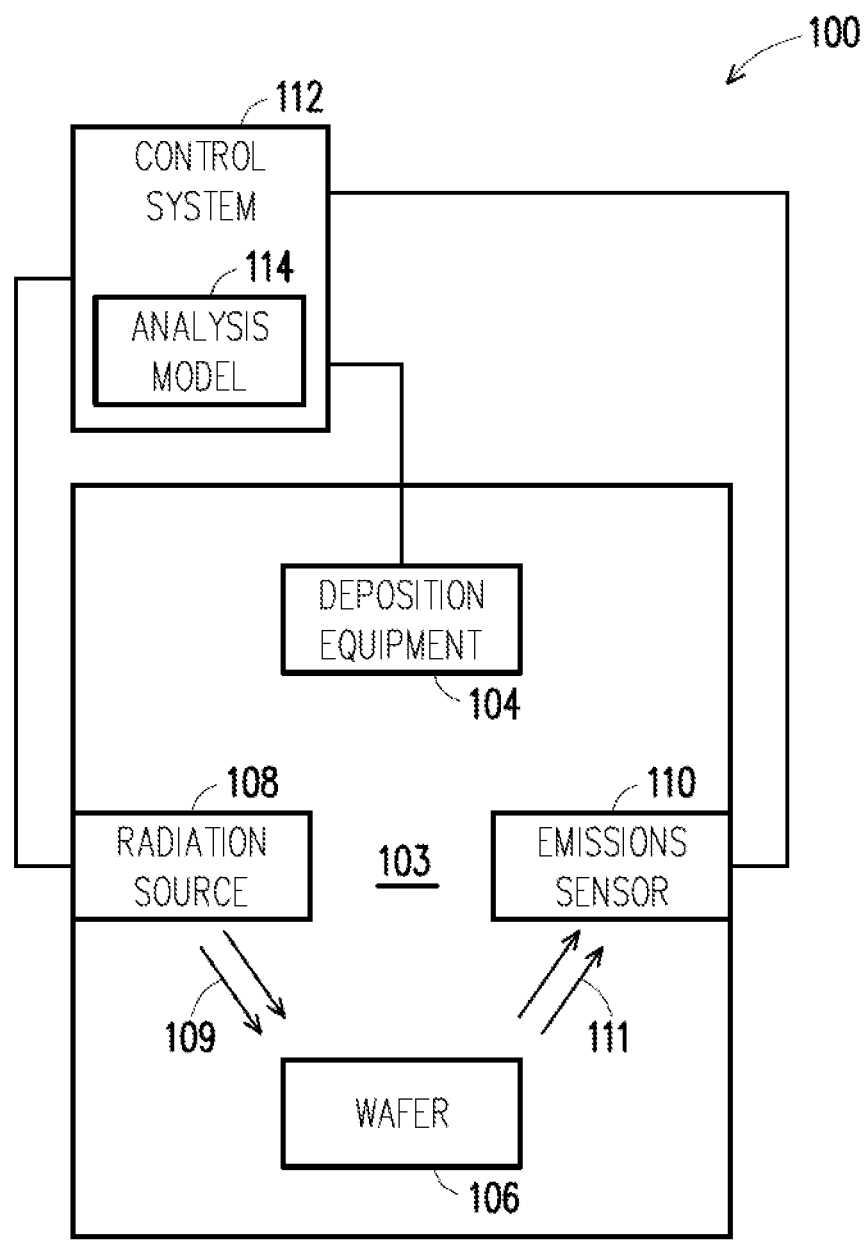
FIG. 1 is a block diagram of a thin-film deposition system, according to one embodiment.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide thin-films of reliable thickness and composition. Embodiments of the present disclosure utilize machine learning techniques to detect contamination or other defects in thin-films. The contamination can be detected in-situ, thereby enabling immediate cessation of thin-film deposition processes immediately after a defective deposition process. Accordingly, rather than having a large number of wafers receive defective thin-films before testing can detect a problem, problems are detected right away and additional wafers will not be affected. Integrated circuits that include the thin-films will not have performance problems that can result if the thin-films are not properly formed. Furthermore, batches of semiconductor wafers will have improved yields and fewer scrapped wafers.

FIG. 1 is a block diagram of a thin-film deposition system 100, according to one embodiment. The thin-film deposition system 100 includes a thin-film deposition chamber 102 defining an interior volume 103. The thin-film deposition system 100 includes deposition equipment 104 configured to perform a thin-film deposition process on a wafer 106 positioned within the interior volume 103. The thin-film deposition system 100 includes a radiation source 108, an emissions sensor 110, and a control system 112. The radiation source 108, the emissions sensor 110, and the control system 112 cooperate to detect contamination of a thin-film formed on the wafer 106.

The thin-film deposition equipment 104 can include deposition equipment positioned outside the thin-film deposition chamber 102, inside the thin-film deposition chamber 102, or both inside and outside the thin-film deposition chamber 102. The deposition equipment 104 can include equipment for performing one or more of physical vapor deposition (PVD) processes, chemical vapor deposition (CVD) processes, atomic layer deposition (ALD) processes, or other types of thin-film deposition processes for forming a thin-film on the wafer 106.

In some cases it is possible that a thin-film may be contaminated during or after a thin-film deposition process. Contamination may occur due to contaminants or impurities in a target material, a precursor material, or other materials introduced into the thin-film deposition chamber 102 during a thin-film deposition process. In many cases, the thin-film deposition processes are performed in vacuum conditions. It is possible that an air leak or another flaw in equipment can allow outside air to enter into the thin-film deposition chamber 102 during a thin-film deposition process in which vacuum conditions are intended. In this case, it is possible that oxygen in the air will oxidize the thin-film. If oxidation of the thin-film occurs, the thin-film may not have the intended structure, composition, and characteristics to perform a selected function in the wafer 106.

The thin-film deposition system 100 utilizes the radiation source 108, the emissions sensor 110, and the control system 112 to detect contamination of the thin-films. The radiation source 108 outputs an excitation light 109. The excitation light 109 irradiates the thin-film formed on the wafer 106. Irradiation of the thin-film formed on the wafer 106 can excite the atoms or molecules of the thin-film. The excited atoms or molecules of the thin-films may output emissions 111 responsive to being energized by the excitation light 109. The emissions 111 can include light or particles, such as electrons, or a combination of light and particles. The emissions 111 collectively have an energy spectrum. The energy spectrum corresponds to the spectrum of emitted light or the energy spectrum of emitted particles. If the emissions 111 include photons, the energy spectrum corresponds to a photon spectrum including the various wavelengths associated with emission photons. If the emissions 111 include particles, such as electrons, then the energy spectrum corresponds to the energies of the emitted particles. The energy spectrum can provide an indication of the types of atoms, molecules, or compounds included in the thin-film.

As used herein, the terms "radiation" and "excitation light" refer to electromagnetic radiation inside or outside of the visible spectrum. Accordingly, the excitation light 109 can include electromagnetic radiation outside the visible spectrum.

Although FIG. 1 illustrates that the radiation source 108 is positioned within the thin-film deposition chamber 102, the radiation source 108 may be positioned outside of the thin-film deposition chamber 102. The radiation source 108 may be positioned partially within the thin-film deposition chamber 102 and partially outside of the thin-film deposition chamber 102. If the radiation source 108 is positioned outside of the thin-film deposition chamber 102, the radiation source 108 may irradiate the wafer 106 via one or more windows or openings in a wall of the thin-film deposition chamber 102.

The emissions sensor 110 is configured to sense the emissions 111. The thin-film may emit emissions 111 in various directions. The emissions sensor 110 is positioned so that some of the emissions 111 will be received by the emissions sensor 110. The emissions sensor 110 senses the wavelengths of the various emissions 111 received by the emissions sensor 110. The emissions sensor 110 outputs sensor signals indicative of the spectrum of the emissions 111.

Although FIG. 1 illustrates that the emissions sensor 110 is positioned within the thin-film deposition chamber 102, the emissions sensor 110 may be positioned outside of the thin-film deposition chamber 102. The emissions sensor 110 may be positioned partially within the thin-film deposition chamber 102 and partially outside of the thin-film deposition chamber 102. If the emissions sensor 110 is positioned outside of the thin-film deposition chamber 102, the emissions sensor 110 may receive emissions 111 via one or more windows or openings in a wall of the thin-film deposition chamber 102.

The control system 112 is coupled to the radiation source 108, the emissions sensor 110, and the deposition equipment 104. The control system 112 receives the sensor signals from the emissions sensor 110. The control system 112 analyzes the sensor signals and determines the spectrum of the emissions 111. The control system 112 can detect contamination of the thin-film based on the spectrum of the emissions 111.

The control system 112 includes the analysis model 114. The analysis model 114 is trained with a machine learning process to detect contamination of the thin-film based on the emission spectrum sensed by the emissions sensor 110. The analysis model 114 can include a neural network or another type of machine learning model. As is set forth in more detail with regards to FIGS. 6 and 7, the analysis model 114 is trained with a training set that includes a plurality of spectra each associated with contaminated or non-contaminated thin-films. The machine learning process utilizes the training set to train the analysis model 114 to reliably detect contamination of the thin-film based on the emission spectrum sensed by the emissions sensor 110.

If the control system 112 detects contamination of the thin-film, the control system 112 can take various responsive actions. For example, the control system 112 can cause the thin-film deposition system 100 to stop operating based on detection of contamination in the thin-film. The control system 112 can output information indicating the type of contamination. For example, if the analysis model 114 detects that the spectrum indicates unwanted oxidation of the thin-film, then the control system 112 can indicate oxygen contamination. If the analysis model 114 detects other types of contamination, then the control system 112 can output information indicating other types of contamination.

The control system 112 can detect contamination of the thin-film in-situ. In other words, the control system 112 can detect contamination of the thin-film during the thin-film deposition process or shortly after the thin-film deposition process while the wafer 106 is still in the thin-film deposition chamber. This can provide tremendous benefits because each wafer 106 can be monitored and contamination can be detected immediately rather than at a later time when a large number of wafers 106 may have been processed and contaminated. This increases wafer yields and reduces the number of scrapped wafers.

The control system 112 can include processing, memory, and information transmission resources. The processing, memory, and information transmission resources can be located at a facility of the thin-film deposition system 100. Alternatively, the processing, memory, and information transmission resources can be located remotely from the facility of the thin-film deposition system 100. The control system 112 may be a distributed control system including resources in multiple locations. The control system 112 can include cloud-based resources and local physical resources.

Figure 2:
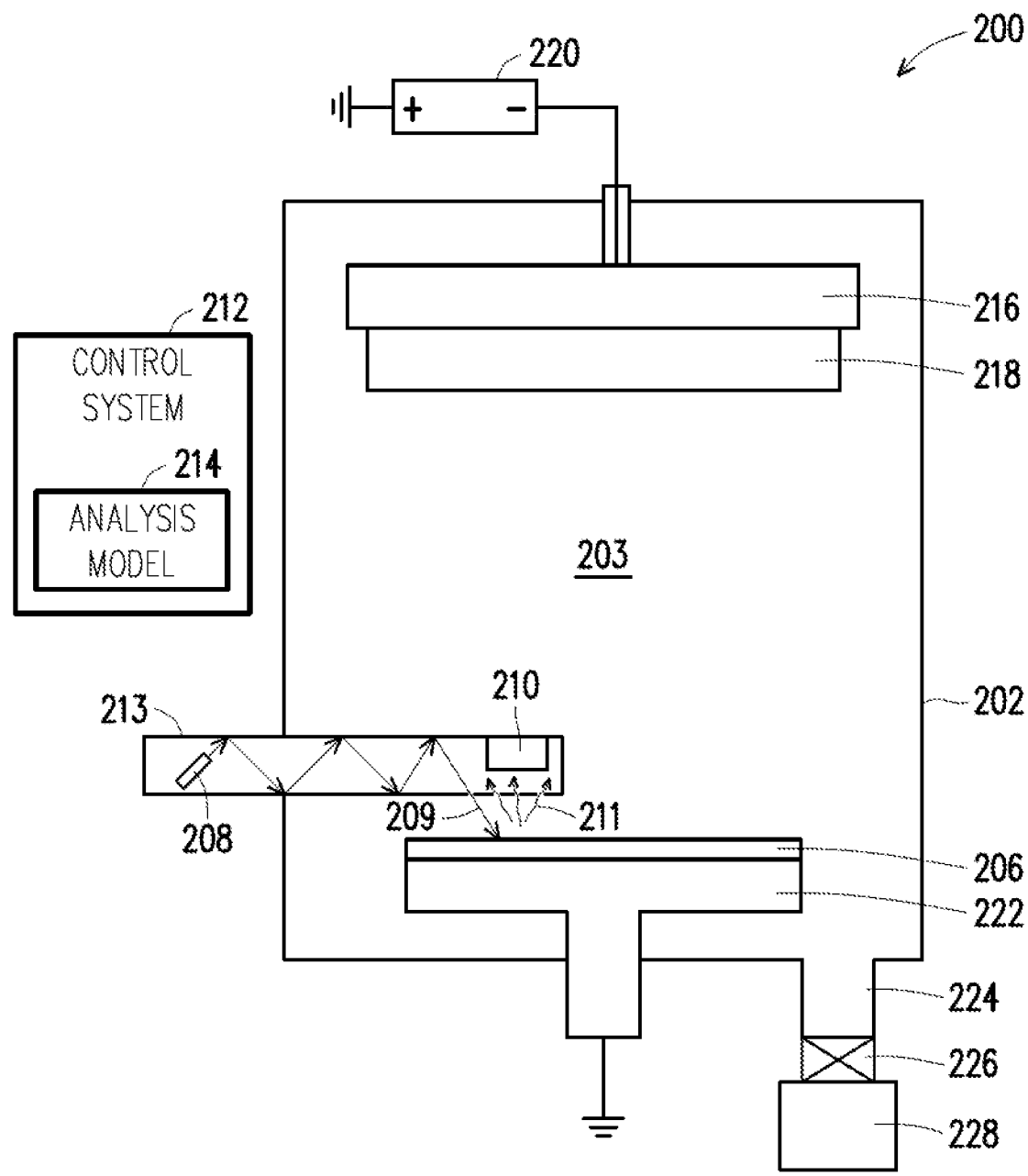
FIG. 2 is an illustration of a thin-film deposition system, according to one embodiment.

FIG. 2 is a block diagram of a thin-film deposition system 200, according to one embodiment. The thin-film deposition system 200 is similar to the thin-film deposition system 100 of FIG. 1, except that the thin-film deposition system 200 is a PVD system implementing an excitation laser and a light sensor. The system 100 can utilize the components, systems, and processes described in relation to FIG. 2. The thin-film deposition system 200 includes a thin-film deposition chamber 202 defining an interior volume 203. A wafer support 222 supports a wafer 206 within the interior volume 203 of the thin-film deposition chamber 202.

In the example of FIG. 2, the thin-film deposition system 200 is a PVD sputtering deposition system, though other types of deposition systems can be utilized without departing from the scope of the present disclosure. The thin-film deposition system 200 includes a sputtering magnetron cathode 216 and a sputtering target 218. During the deposition process, a voltage source 220 applies a voltage signal to the sputtering magnetron cathode 216. The result is that atoms are ejected from the sputtering target 218. The wafer support 222 acts as a grounded anode of the sputtering system. Atoms from the sputtering target 218 accumulate on the surface of the wafer 206. The result is that a thin-film is deposited on the wafer 206.

The thin-film deposition system 200 also includes an exhaust channel 224 communicatively coupled to the interior volume 203 of the thin-film deposition chamber 202. A valve 226 couples the exhaust channel 224 to a pump 228. Prior to the thin-film deposition process, the valve 226 is opened and the pump 228 is activated. The pump 228 generates a vacuum within the interior volume 203 by pumping fluids from the interior volume 203. When the interior volume is below a threshold pressure, i.e., substantially at vacuum, the PVD process can begin.

In one example, the thin-film deposition process is a titanium nitride deposition process. In this case, the sputtering target 218 is a titanium sputtering target. After the interior volume is evacuated by the pump 228, nitrogen is flowed into the interior volume 203. The sputtering process begins in the presence of the nitrogen. The result is that a titanium nitride thin-film is deposited on the wafer 206.

In some cases it is possible that due to a leak in the thin-film deposition chamber 202, air can enter into the interior volume 203 during the deposition process. If this occurs, then the titanium nitride thin-film may oxidize, resulting in the presence of titanium oxide in the thin-film. The presence of titanium oxide in the thin-film will result in the thin-film not being able to perform its function as a barrier layer or glue layer, as the case may be.

In order to detect oxidation, or other contamination of the thin-film, the thin-film deposition system 200 includes an excitation laser 208 and a light sensor 210. The excitation laser 208 and the light sensor 210 may be positioned in a tube 213 that extends from an exterior of the thin-film deposition chamber 202 to the interior of the thin-film deposition chamber 202. The interior surface of the tube 213 may be substantially reflective for most of the extent of the tube 213. An end of the tube 213 may be transparent such that excitation light and emission photons can pass through. In FIG. 2, the transparent portion of the tube is indicated by dashed lines. In one example, the transparent portion of the tube differs from the reflective portion of the tube in that the transparent portion of the tube 213 does not include a reflective coating, while the reflective portion of the tube 213 includes a reflective coating.

The excitation laser 208 outputs excitation light 209. The excitation light reflects within the reflective portion of the tube. At the nonreflective portion of the tube, the excitation light 209 passes from the tube 213 into the interior volume 203 of the thin-film deposition chamber 202. The excitation light 209 then irradiates the wafer 206. In particular, the excitation light 209 irradiates the thin-film deposited on the wafer 206.

Some of the excitation light 209 is absorbed by the thin-film. The result is that valence electrons in the atoms or compounds of the thin-film transition from lower energy levels to higher energy levels. Subsequently, the electrons return from the higher energy levels to the lower energy levels. When the electrons return from the higher energy levels to the lower energy levels, the electrons emit emission photons 211 with an energy corresponding to the difference in the energy levels.

The spectrum of emission photons 211 emitted by the thin-film is indicative of the composition of the thin-film. Different materials will emit photons of different wavelengths based on the atoms or molecules that make up the materials. Accordingly, the photon spectrum of the emission photons 211 from the thin-film responsive to irradiation with the excitation light is indicative of the composition of the thin-film.

The light sensor 210 is configured to receive and sense the emission photons 211. In particular, the light sensor 210 is positioned at the transparent end of the tube 213 such that emission photons 211 are able to pass through the tube 213 and be received by the light sensor 210. The light sensor 210 can be configured to sense light in a range of wavelengths corresponding to an expected range of wavelengths for emission photons to 211 from contaminated and non-contaminated thin-films.

Returning to the example in which the thin-film deposition system 200 deposits a titanium nitride thin-film, the excitation laser 208 emits an excitation light of between 300 nm and 330 nm. This range is selected because one possible contamination of titanium nitride is oxidation of the titanium nitride. Oxidation of the titanium nitride results in titanium oxide, which is a semiconductor material with a bandgap of about 3.2 eV. Photons in the range of 300 nm and 330 nm have sufficient energy (~3.7 eV-4.1 eV) to excite electrons to in the valence band to transition to the conduction band. Accordingly, the excitation laser 208 is selected so that the excitation photons have an energy greater than the bandgap of titanium oxide. Electrons in the valence band can absorb photons of the excitation light and transition through the bandgap to the conduction band. When the electrons transition back from the conduction band to the valence band, the electrons will emit emission photons 211 with an energy corresponding to the difference between the energy level of the valence band and the energy level from which the electron returned in the conduction band.

In one example, TiO$_2$ has a photoluminescence spectrum with an intensity peak centered about 360 nm. Accordingly, analysis of the spectrum of emission photons 211 can indicate whether the spectrum corresponds to TiO$_2$, indicating contamination of the thin-film by oxidation. In this example, the light sensor 210 can be an ultraviolet radiation sensor with particular sensitivity to ultraviolet light in a range between 200 nm and 400 nm. Correspondingly, the excitation laser 208 can be an ultraviolet laser.

While a particular example has been given of a titanium nitride thin-film contaminated by oxidation, the thin-film deposition system 200 can include many other types of deposition processes, thin-films, contamination detections, radiation sources and radiation sensors that the particular examples described herein, without departing from the scope of the present disclosure. For example, the thin film can include Ti, TiAl, TiON, TiAlO, TiAl, TiAlC, a middle end of line (MEOL) contact metal, a front end of line (FEOL) high-K cap or metal gate, or other types of thin films.

The control system 212 is coupled to the excitation laser 208, the light sensor 210, and the voltage source 220. The control system 212 receives sensor signals from the light sensor 210. The sensor signals from the light sensor 210 indicate the spectrum of emission photons 211 received by the light sensor 210 from the thin-film. The control system 212 analyzes the sensor signals to determine whether the spectrum of emission photons corresponds to a contaminated thin-film or properly formed thin-film. If the control system 212 determines that the photon spectrum corresponds to a contaminated thin-film, then the control system 212 can shut down the thin-film deposition system 200 and can output an alert. In the example of oxidation of a titanium nitride thin-film, the alert can indicate a leak in the thin-film deposition chamber 202.

The control system 212 includes an analysis model 214. The analysis model 214 is trained with a machine learning process to reliably detect photon spectra indicating various types of contamination or properly formed thin-films. Further details regarding training of an analysis model are provided in relation to FIGS. 6 and 7.

While FIG. 2 illustrates an excitation laser 208 and a light sensor 210 that senses emission photons, the thin-film deposition system 200 can include other types of excitation sources and radiation sensors. In one embodiment, the excitation source is an x-ray source that emits x-ray radiation. The x-ray source irradiates the thin-film with x-rays. X-rays are high energy photons. The high-energy x-ray photons energize the thin-film and cause the thin-film to emit electrons via the photoelectric effect.

In the example of an x-ray source, the light sensor 210 is, instead, a photoelectron sensor. The emissions from the thin-film responsive to the x-rays are photoelectrons. The photoelectron sensor can determine the energy of the electrons received from the thin-film via the photoelectric effect. Because the energy of the x-rays is known and because the energy of the emitted electrons is measured by the photoelectron sensor, the electron binding energy of the emitted electrons can be determined. The electron binding energy of electrons emitted from the thin-film is indicative of the material of the thin-film. Accordingly, by analyzing the spectrum of energies of the emitted electrons, the composition of the thin-film can be determined. In this case, the analysis model can determine whether the thin-film was contaminated based on the energy spectrum of the photoelectrons.

Figure 3:
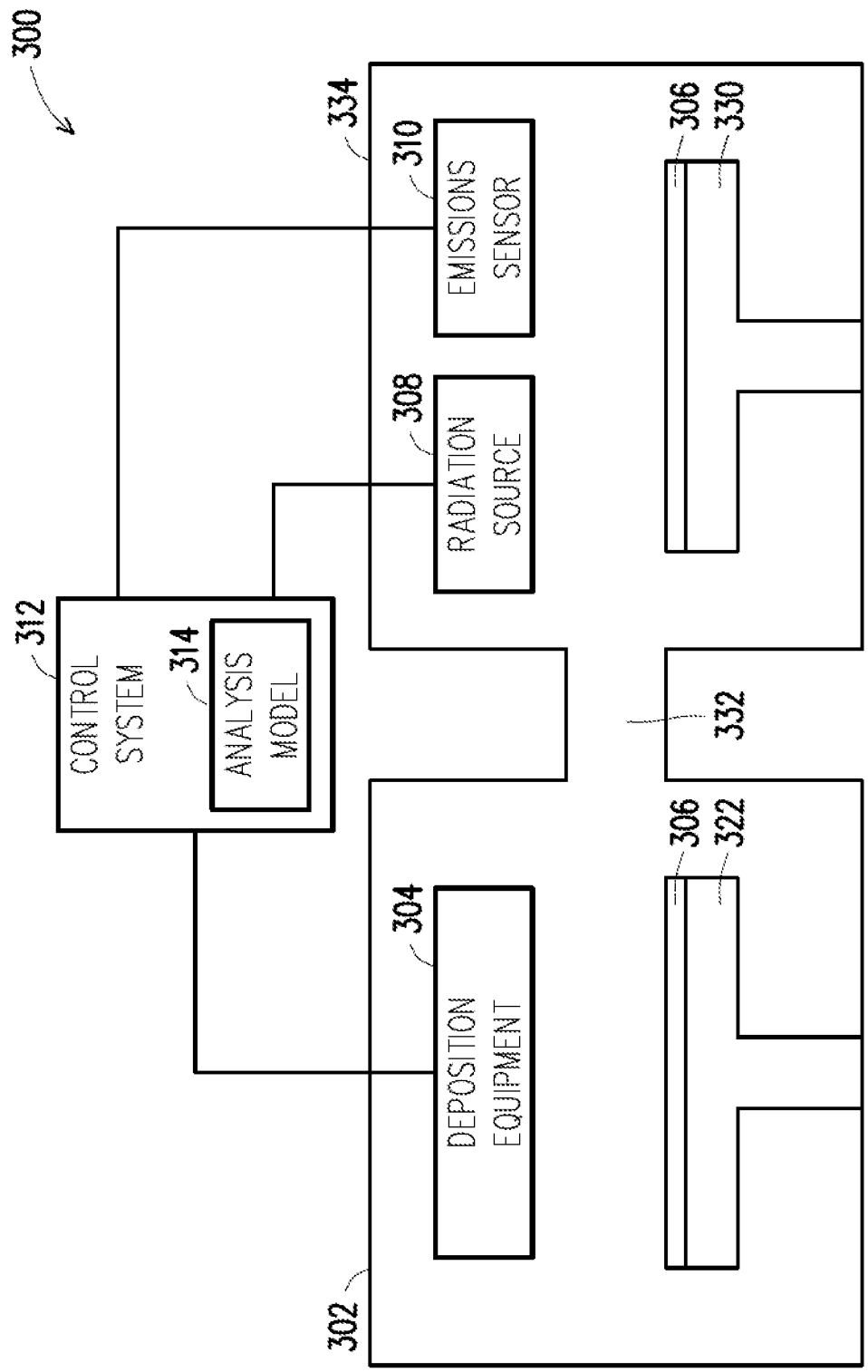
FIG. 3 is an illustration of a thin-film deposition system, according to one embodiment.

FIG. 3 is an illustration of a thin-film deposition system 300, according to one embodiment. The thin-film deposition system 300 is similar in many ways to the thin-film deposition systems 100, 200 of FIGS. 1 and 2, except that the thin-film deposition system 300 includes separate chambers for thin-film deposition and thin-film measurement. The thin-film deposition system 300 includes a thin-film deposition chamber 302 and a thin-film analysis chamber 334. The thin-film deposition system 300 includes deposition equipment 304 configured to perform a thin-film deposition process on a wafer 306 supported by a support 322 in the thin-film deposition chamber 302.

The thin-film analysis chamber 334 and the thin-film deposition chamber 302 are communicatively coupled by a transfer channel 332. After a thin-film deposition process has been performed on the wafer 306, the wafer 306 is transported via the transfer channel 332 to the thin-film analysis chamber 334. The thin-film analysis chamber 334 includes a support 330. The wafer 306 is positioned on the support 330 after being transferred from the thin-film deposition chamber 302. The wafer 306 can be transferred by a robot arm (not pictured in FIG. 3).

In one embodiment, because the thin-film deposition chamber 302 and the thin-film analysis chamber 334 are coupled together by the transfer channel 332, the vacuum or pressure condition in the thin-film deposition chamber 302 is communicated to the thin-film analysis chamber 334. This means that when the wafer 306 is transferred from the thin-film deposition chamber 302 to the thin-film analysis chamber 334, the wafer 306 does not pass through an additional contamination environment.

A radiation source 308 and the emissions sensor 310 are positioned in or adjacent to the thin-film analysis chamber 334. The radiation source 308 is configured to irradiate the wafer 306 with excitation light. The emissions sensor 310 is configured to receive and sense emissions from the wafer 306 responsive to the excitation light. The radiation source 308 and the emissions sensor 310 can include the same types of radiation sources and emissions sensors as those described in relation to FIGS. 1 and 2.

The control system 312 can receive the emission spectrum signals from the emissions sensor 310. The analysis model 314 can analyze the spectrum and determine whether or not the thin-film is contaminated. If the thin-film is contaminated, the control system 312 can output an alert and stop operation of the thin-film deposition system 300.

Figure 4:
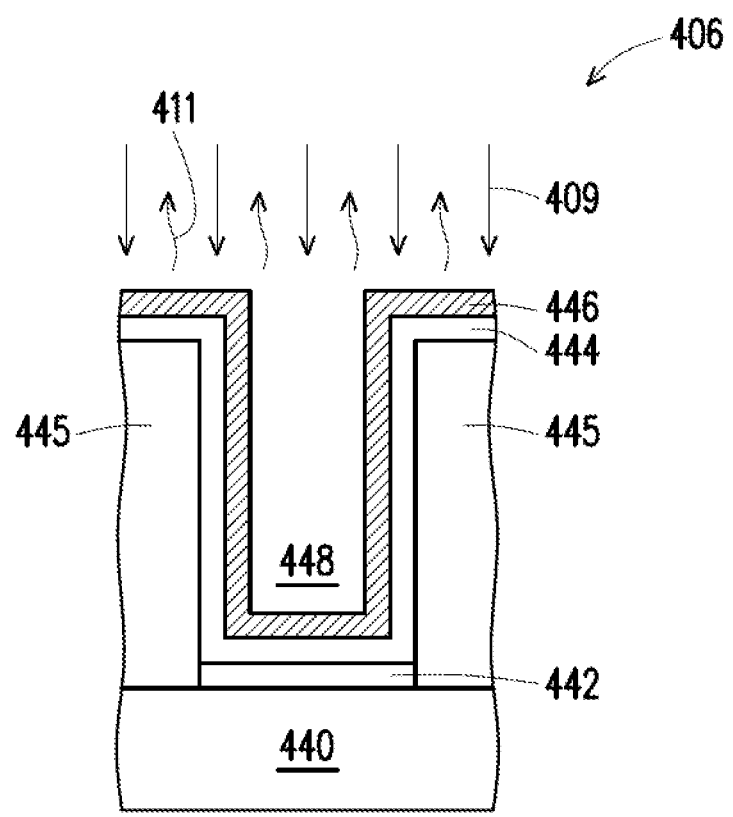
FIG. 4 is a cross-sectional view of a semiconductor wafer, according to one embodiment.

FIG. 4 is a cross-sectional view of a wafer 406, according to one embodiment. The wafer 406 includes a nanosheet structure 440. An interfacial layer 442 is positioned over the nanosheet structure. A high K gate dielectric layer 444 is positioned on the interfacial layer 442 and on sidewalls of a trench 448 formed in a layer of dielectric material 445. The trench 448 is formed to be filled by a gate electrode of a nanosheet transistor.

Before deposition of the gate electrode, a layer of titanium nitride 446 is formed on the high K gate dielectric layer 444. The layer of titanium nitride acts as a work function layer for the gate electrode that will be formed in the trench 448. The titanium nitride increases the work function and improves the overall function of the nanosheet transistor.

The layer of titanium nitride 446 is an example of a thin-film layer formed in the thin-film deposition systems of FIGS. 1-3. After formation of the layer of titanium nitride 446, a radiation source irradiates the layer of titanium nitride 446 with excitation light 409. The excitation light 409 can correspond to the various examples of excitation light given in relation to FIGS. 1-3. Accordingly, the excitation light can include ultraviolet radiation, x-ray radiation, or other types of radiation emitted from a radiation source.

The layer of titanium nitride 446 absorbs some of the excitation light 409 and outputs emissions 411. The emissions 411 can include photoluminescence photons emitted from the layer of titanium nitride 446 responsive to absorbing the excitation light 409. Alternatively, the emissions 411 can include photoelectrons ejected from the layer of titanium nitride 446 responsive to absorbing the excitation light 409.

A radiation sensor (not shown) can receive and sense the emissions 411. The radiation sensor can include the types of emissions sensors described in relation to FIGS. 1-3, or other types of radiation sensors. The radiation sensor can provide sensor signals to a control system including an analysis model as described in relation to FIGS. 1-3. The control system and the analysis model can determine whether the titanium nitride has been contaminated based on the spectrum of the emissions 411, as described previously in relation to FIGS. 1-3, and as will be described in further detail in relation to FIGS. 6 and 7.

Figure 5:
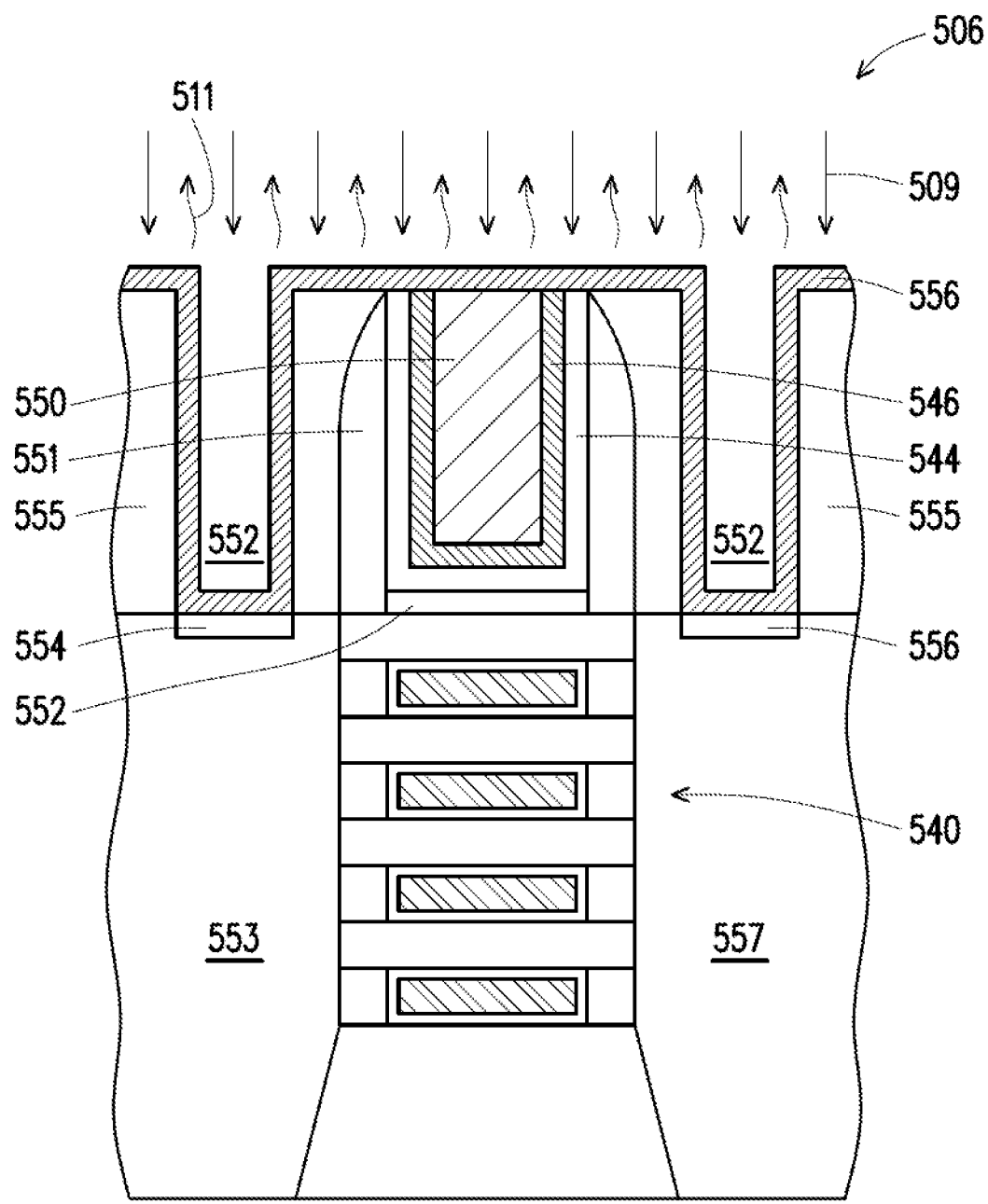
FIG. 5 is a cross-sectional view of a semiconductor wafer, according to one embodiment.

FIG. 5 is a cross-sectional view of a wafer 506, according to one embodiment. The wafer 506 includes a nanosheet structure 540. An interfacial layer 542 is positioned over the nanosheet structure 540. A high K dielectric layer 544 is positioned on the interfacial layer 542. Sidewall spacers 551 are positioned adjacent to the high K dielectric layer 544. A work function layer of titanium nitride 546 is positioned on the high K dielectric layer 544. The gate electrode 550 is formed in contact with the work function layer of titanium nitride 546. Trenches 552 are formed in a layer of dielectric material 555. The trenches 552 are for source and drain electrodes. A source region 553 at the drain region 557 or adjacent to the nanosheet structure 540. Silicide layers 554 and 556 are positioned at the source and drain regions by 53 and 557. A glue layer of titanium nitride 556 is formed on the layer of dielectric material 555, on the sidewalls of the trenches 552, and on the gate electrode 550.

The layer of titanium nitride 556 is an example of a thin-film layer formed in the thin-film deposition systems of FIGS. 1-3. After formation of the layer of titanium nitride 556, a radiation source irradiates the layer of titanium nitride 556 with excitation light 509. The excitation light 509 can correspond to the various examples of excitation light given in relation to FIGS. 1-3. Accordingly, the excitation light can include ultraviolet radiation, x-ray radiation, or other types of radiation emitted from a radiation source.

The layer of titanium nitride 556 absorbs some of the excitation light 509 and outputs emissions 511. The emissions 511 can include photoluminescence photons emitted from the layer of titanium nitride 556 responsive to absorbing the excitation light 509. Alternatively, the emissions 511 can include photoelectrons ejected from the layer of titanium nitride 556 responsive to absorbing the excitation light 509.

A radiation sensor (not shown) can receive and sense the emissions 511. The radiation sensor can include the types of emissions sensors described in relation to FIGS. 1-3, or other types of radiation sensors. The radiation sensor can provide sensor signals to a control system including an analysis model as described in relation to FIGS. 1-3. The control system and the analysis model can determine whether the titanium nitride has been contaminated based on the spectrum of the emissions 511, as described previously in relation to FIGS. 1-3, and as will be described in further detail in relation to FIG. 6.

While particular layers of titanium nitride are described in relation to FIGS. 4 and 5, principles of the present disclosure extend to other types of thin-films deposited and other types of structures and with other types of deposition processes. Detecting contamination with an analysis model, a radiation source, and an emissions sensor can be utilized for a large variety of thin-films and many different types of contamination.

Figure 6:
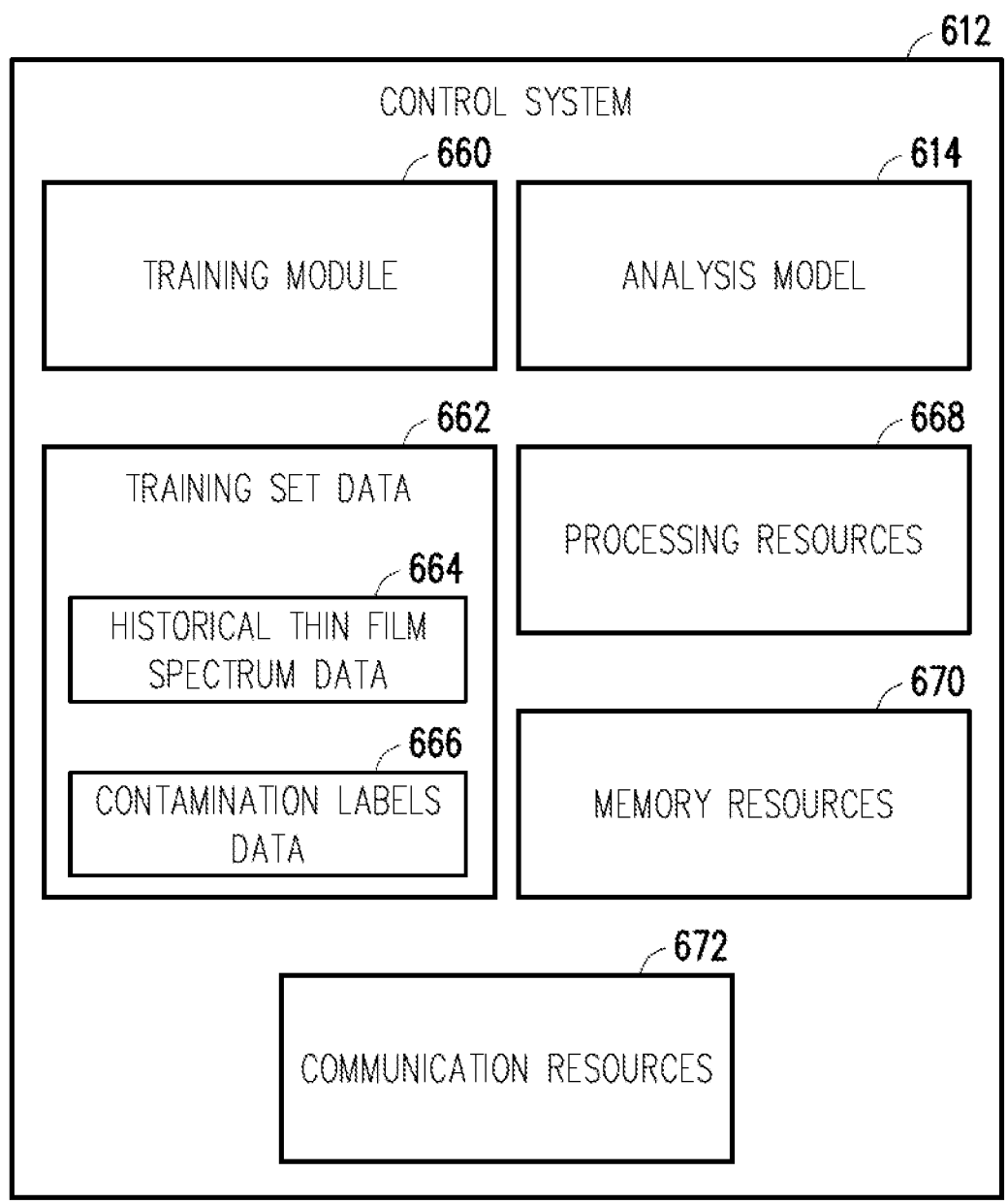
FIG. 6 is a block diagram of a control system, according to one embodiment.

FIG. 6 is a block diagram of a control system 612, according to one embodiment. The control systems 112, 212, and 312 of FIGS. 1-3 can include the components and functionality of the control system 612. Accordingly, the control system 612 can be implemented with the systems, processes and components described in relation to FIGS. 1-5. The control system 612 of FIG. 6 is configured to control operation of a thin-film deposition system, according to one embodiment. The control system 612 utilizes machine learning to determine whether or not a thin-film is contaminated or otherwise improperly formed. The control system 612 can detect contamination of the thin-film and stop further thin-film deposition processes before additional wafers can be affected with in properly formed thin-films. The control system 612 can raise an alert indicating a problem with the thin-film deposition process.

In one embodiment, the control system 612 includes an analysis model 614 and a training module 660. The training module trains the analysis model 614 with a machine learning process. The machine learning process trains the analysis model 614 to detect whether or not a thin-film is contaminated based on emission spectra from the thin-film. Although the training module 660 is shown as being separate from the analysis model 614, in practice, the training module 660 may be part of the analysis model 614.

The control system 612 includes, or stores, training set data 642. The training set data 642 includes historical thin-film spectrum data 664 and contamination labels data 666. The historical thin-film spectrum data 664 includes emission spectra for large number of thin-films. The contamination labels data 666 includes, for each emission spectrum in the historical thin-film spectrum data 664, data indicating whether or not the emission spectrum corresponds to a contaminated thin-film. As will be set forth in more detail below, the training module 660 utilizes the historical thin-film spectrum data 664 and the contamination labels data 666 to train the analysis model 614 with a machine learning process.

In one embodiment, the historical thin-film spectrum data 664 includes data related to emissions spectra for a large number of thin-films. The emission spectra include the spectrum of photons or photoelectrons emitted by each of a large number of thin-films. In the case of photons spectra, each spectrum includes the distribution of photons of various energies, wavelengths, or frequencies for a particular previously analyzed thin-film. In the case of the electron spectra, each spectrum includes the distribution of energies of electrons for a particular previously analyzed thin-film.

In one embodiment, the contamination labels data 666 includes for each historical thin-film spectrum in the historical thin-film spectrum data 664, a respective label. Each label indicates either contamination or non-contamination. Because there can be multiple types of contamination, there can be multiple types of contamination labels. In other words, labels indicating contamination can fall into one of a plurality of categories of contamination depending on the various ways that a thin-film can be contaminated during a thin-film deposition process.

In one embodiment the analysis model 614 includes a neural network. Training of the analysis model 614 will be described in relation to a neural network. However, other types of analysis models or algorithms can be used without departing from the scope of the present disclosure. The training module 660 utilizes the training set data 642 to train the neural network with a machine learning process. During the training process, the neural network receives, as input, historical thin-film spectrum data 664 from the training set data 662. During the training process, the neural network outputs predicted category data. The predicted category data predicts, for each thin-film spectrum provided to the analysis model 614, the category into which the spectrum falls. The categories can include contamination, non-contamination, or various individual categories of contamination and non-contamination. The training process trains the neural network to generate predicted category data that matches the contamination labels data 666 for each thin-film spectrum.

In one embodiment, the neural network includes a plurality of neural layers. The various neural layers include neurons that define one or more internal functions. The internal functions are based on weighting values associated with neurons of each neural layer of the neural network. During training, the control system 612 compares, for each set of historical thin-film spectrum data, the predicted category data to the actual label from the contamination labels data 666. The control system generates an error function indicating how closely the predicted category data matches the contamination labels data 666. The control system 612 then adjusts the internal functions of the neural network. Because the neural network generates predicted category data based on the internal functions, adjusting the internal functions will result in the generation of different predicted category data for a same set of historical thin-film spectrum data. Adjusting the internal functions can result in predicted category data that produces larger error functions (worse matching to the contamination labels data 666) or smaller error functions (better matching to the contamination labels data 666).

After adjusting the internal functions of the neural network, the historical thin-film spectrum data 664 is again passed to the neural network and the analysis model 614 again generates predicted category data. The training module 660 again compares the predicted category data to the contamination labels data 666. The training module 660 again adjusts the internal functions of the neural network. This process is repeated in a very large number of iterations of monitoring the error functions and adjusting the internal functions of the neural network until a set of internal functions is found that results in predicted category data that matches the contamination labels data 666 across the entire training set.

At the beginning of the training process, the predicted category data likely will not match the contamination labels data 666 very closely. However, as the training process proceeds through many iterations of adjusting the internal functions of the neural network, the errors functions will trend smaller and smaller until a set of internal functions is found that results in predicted category data that match the contamination labels data 666. Identification of a set of internal functions that results in predicted category data that matches the contamination labels data 666 corresponds to completion of the training process. Once the training process is complete, the neural network is ready to be used to adjust thin-film deposition process parameters.

In one embodiment, after the analysis model 614 has been trained, the analysis model 614 can be utilized to analyze emission spectra of thin-films. In particular, as described in relation to FIGS. 1-5, a thin-film can be irradiated with an excitation light from a radiation source. The thin-film will then output emissions, such as photoluminescence photons or photoelectrons, as the case may be. A radiation sensor can then sense the energy spectrum of the missions. The radiation sensor can pass the sensor signals to the analysis model 614. The analysis model 614 analyzes the spectrum data and the signs the spectrum to a category. The category can include contamination, non-contamination, or various subcategories of contamination and non-contamination. The control system 612 can output an alert and stop further thin-film deposition processes if the category indicates contamination.

In one embodiment, the control system 612 includes processing resources 668, memory resources 670, and communication resources 672. The processing resources 668 can include one or more controllers or processors. The processing resources 668 are configured to execute software instructions, process data, make thin-film deposition control decisions, perform signal processing, read data from memory, write data to memory, and to perform other processing operations. The processing resources 668 can include physical processing resources 668 located at a site or facility of the thin-film deposition system. The processing resources can include virtual processing resources 668 remote from the site thin-film deposition system or a facility at which the thin-film deposition system is located. The processing resources 668 can include cloud-based processing resources including processors and servers accessed via one or more cloud computing platforms.

In one embodiment, the memory resources 670 can include one or more computer readable memories. The memory resources 670 are configured to store software instructions associated with the function of the control system and its components, including, but not limited to, the analysis model 614. The memory resources 670 can store data associated with the function of the control system 612 and its components. The data can include the training set data 642, current process conditions data, and any other data associated with the operation of the control system 612 or any of its components. The memory resources 670 can include physical memory resources located at the site or facility of the thin-film deposition system 100. The memory resources can include virtual memory resources located remotely from site or facility of the thin-film deposition system 100. The memory resources 670 can include cloud-based memory resources accessed via one or more cloud computing platforms.

In one embodiment, the communication resources can include resources that enable the control system 612 to communicate with equipment associated with the thin-film deposition system 100. For example, the communication resources 672 can include wired and wireless communication resources that enable the control system 612 to receive the sensor data associated with the thin-film deposition system and to control equipment of the thin-film deposition system. The communication resources 672 can enable the control system 612 to control the various components of the thin-film deposition system. The communication resources 672 can enable the control system 612 to communicate with remote systems. The communication resources 672 can include, or can facilitate communication via, one or more networks such as wide networks, wireless networks, the Internet, or an intranet. The communication resources 672 can enable components of the control system 612 to communicate with each other.

In one embodiment, the analysis model 614 is implemented via the processing resources 668, the memory resources 670, and the communication resources 672. The control system 612 can be a dispersed control system with components and resources and locations remote from each other and from the thin-film deposition system.

The components, functionality, and processes described in relation to the control system 612 and the analysis model 614 can be extended to the control systems and analysis models described in relation to FIGS. 1-5.

Figure 7:
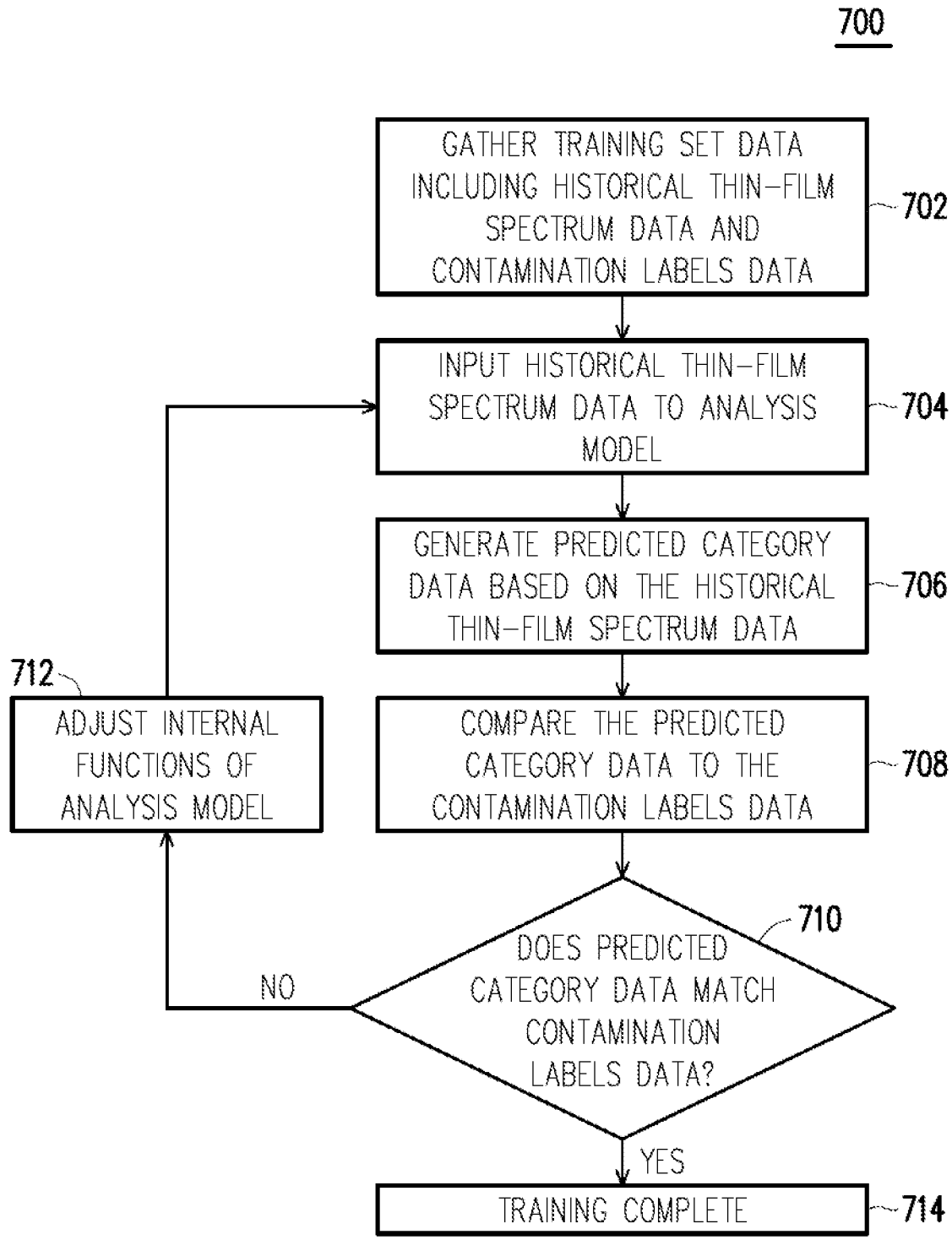
FIGS. 7-13 are flow diagrams of methods for detecting defects in thin-films, according to various embodiments

FIG. 7 is a flow diagram of a process 700 for training an analysis model to determine whether a thin-film is contaminated or not, according to one embodiment. The process 700 can be implemented utilizing systems, components, and processes described in relation to FIGS. 1-6. The process 700 can also be implemented using other systems, components, and processes. One example of an analysis model is the analysis model 614 of FIG. 6, though the process 700 of FIG. 7 can apply to the analysis models described in any of the previous figures. The various steps of the process 700 can utilize components, processes, and techniques described in relation to FIGS. 1-6. Accordingly, FIG. 7 is described with reference to FIGS. 1-6.

At 702, the process 700 gathers training set data including historical thin-film spectrum data and contamination labels data. One example of training set data is the training set data 662 of FIG. 6. This can be accomplished by using a data mining system or process. The data mining system or process can gather training set data by accessing one or more databases associated with thin-film deposition systems and collecting and organizing various types of data contained in the one or more databases. The data mining system or process, or another system or process, can process and format the collected data in order to generate a training set data. The training set data can include historical thin-film spectrum data and contamination labels data as described in relation to FIG. 6.

At 704, the process 700 inputs historical thin-film spectrum data to the analysis model. In one example, this can include inputting contamination labels data to the analysis model with a training module as described in relation to FIG. 6. One example of contamination labels data is the contamination labels data 666 of FIG. 6. The historical thin-film spectrum data can be provided in consecutive discrete sets to the analysis model. One example of historical thin-film data is the historical thin-film data 664 of FIG. 6. Each discreet set can correspond to a single thin-film or to groups of thin-film. The historical thin-film spectrum data can be provided as vectors to the analysis model. Each set can include one or more vectors formatted for reception and processing by the analysis model. The historical thin-film spectrum data can be provided to the analysis model in other formats without departing from the scope of the present disclosure.

At 706, the process 700 generates predicted category data based on historical thin-film spectrum data. In particular, the analysis model generates, for each set of historical thin-film spectrum data, predicted category data. The predicted category data corresponds to a prediction category of contamination or non-contamination. This can be performed by the training module 660 or the analysis model 614 of FIG. 6.

At 708, the predicted category data is compared to the historical thin-film spectrum data 664. In particular, the predicted category data for each set of historical thin-film spectrum data is compared to the contamination labels data associated with that set of historical thin-film spectrum data. The comparison can result in an error function indicating how closely the predicted category data matches the contamination labels data. This comparison is performed for each set of predicted category data. In one embodiment, this process can include generating an aggregated error function or indication indicating how the totality of the predicted category data compares to the contamination labels data. These comparisons can be performed by the training module or by the analysis model. The comparisons can include other types of functions or data than those described above without departing from the scope of the present disclosure. This can be performed by the training module 660 or the analysis model 614 of FIG. 6.

At 710, the process 700 determines whether the predicted category data matches the contamination labels data based on the comparisons generated at step 708. In one example, if the aggregate error function is less than an error tolerance, then the process 700 determines that the predicted category data does not match the contamination labels data. In one example, if the aggregate error function is greater than an error tolerance, then the process 700 determines that the predicted category data does match the contamination labels data. In one example, the error tolerance can include a tolerance between 0.1 and 0. In other words, if the aggregate percentage error is less than 0.1, or 10%, then the process 700 considers that the predicted category data matches the contamination labels data. If the aggregate percentage error is greater than 0.1 or 10%, then the process 700 considers that the predicted category data does not match the contamination labels data. Other tolerance ranges can be utilized without departing from the scope of the present disclosure. Error scores can be calculated in a variety of ways without departing from the scope of the present disclosure. The training module or the analysis model can make the determinations associated with process step 710. This can be performed by the training module 660 or the analysis model 614 of FIG. 6.

In one embodiment, if the predicted category data does not match the historical thin-film spectrum data at step 710, then the process proceeds to step 712. At step 712, the process 700 adjusts the internal functions associated with the analysis model. In one example, the training module adjusts the internal functions associated with the analysis model. From step 712, the process returns to step 704. At step 704, the historical thin-film spectrum data is again provided to the analysis model. Because the internal functions of the analysis model have been adjusted, the analysis model will generate different predicted category data than in the previous cycle. The process proceeds to steps 706, 708 and 710 and the aggregate error is calculated. If the predicted category data does not match the contamination labels data, then the process returns to step 712 and the internal functions of the analysis model are adjusted again. This process proceeds in iterations until the analysis model generates predicted category data that matches the contamination labels data. This can be performed by the training module 660 or the analysis model 614 of FIG. 6.

In one embodiment, if the predicted category data matches the historical contamination labels data and process step 710, then the process 700 proceeds to 714. At step 714 training is complete. The analysis model is now ready to be utilized to identify process conditions can be utilized in thin-film deposition processes performed by the thin-film deposition system. The process 700 can include other steps or arrangements of steps than shown and described herein without departing from the scope of the present disclosure.

Figure 8:
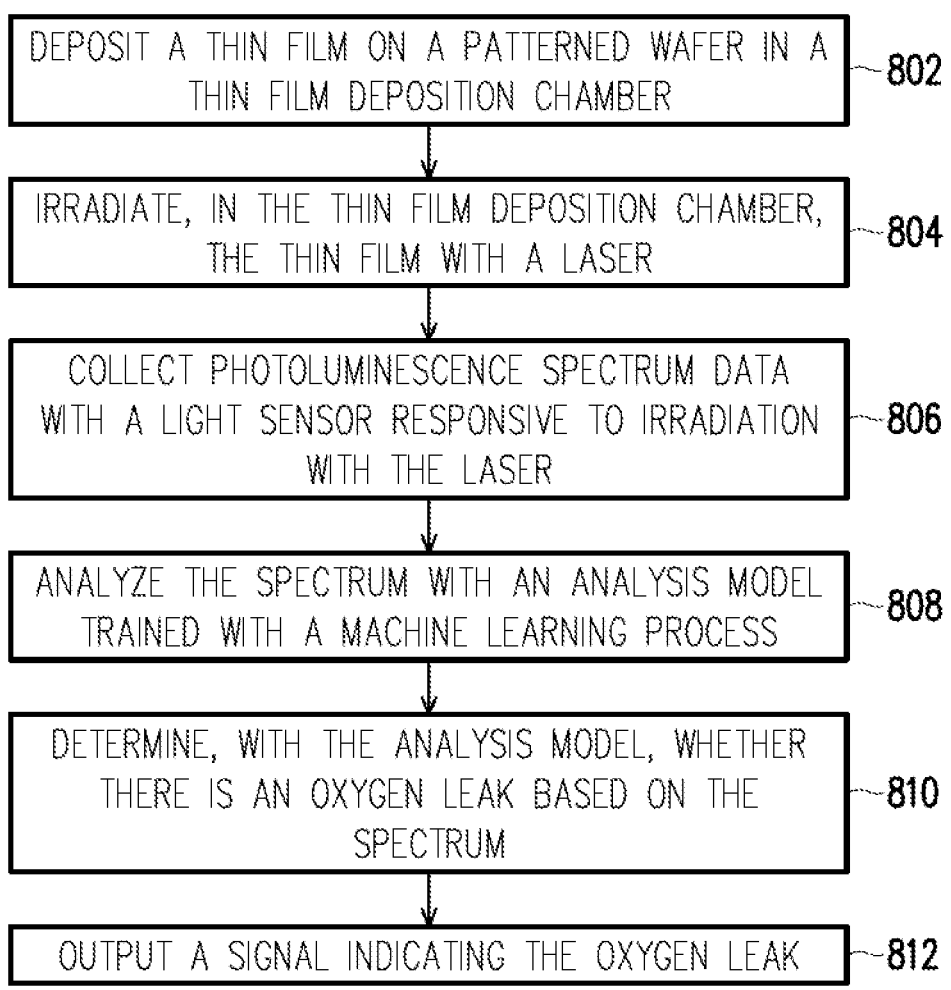

FIG. 8 is a flow diagram of a thin-film deposition method 800, according to one embodiment. The method 800 can be implemented utilizing systems, components, and processes described in relation to FIGS. 1-7. The method 800 can also be implemented using other systems, components, and processes. At 802, the method 800 includes depositing a thin-film on a patterned wafer in a thin-film deposition chamber. One example of a wafer is the wafer 106 of FIG. 1. One example of a thin-film deposition chamber is the thin-film deposition chamber 102 of FIG. 1. At 804, the method 800 includes irradiating, in the thin-film deposition chamber, the thin-film with a laser. One example of a laser is the excitation laser 208 of FIG. 2. At 806, the method 800 includes collecting photoluminescence spectrum data with a light sensor responsive to irradiation with the laser. One example of a light sensor is the light sensor 210 of FIG. 2. At 808, the method 800 includes analyzing the spectrum with an analysis model trained with a machine learning process. One example of an analysis model is the analysis model 214 of FIG. 2. At 810, the method 800 includes determining, with the analysis model, whether there is an oxygen leak based on the spectrum. At 812, the method 800 includes, if there is an oxygen leak, outputting a signal indicating the oxygen leak.

Figure 9:
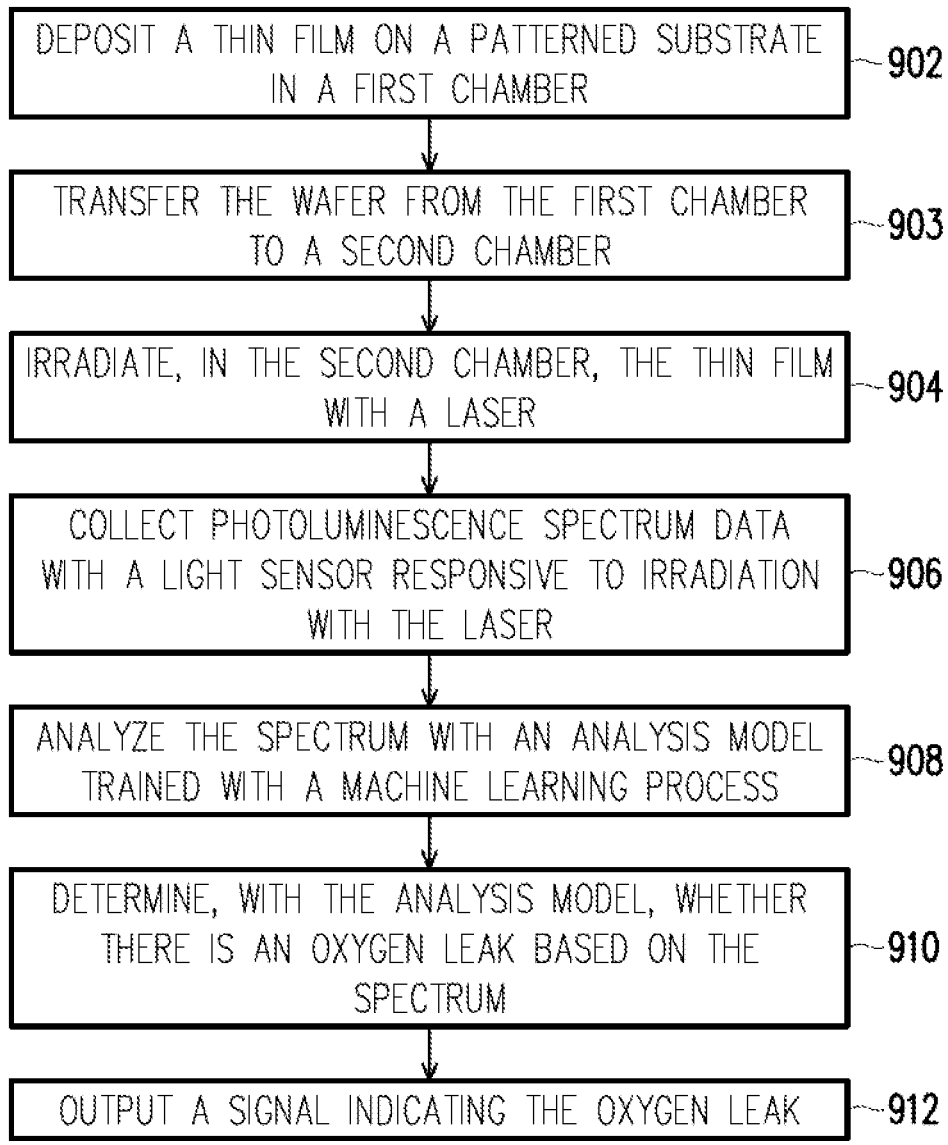

FIG. 9 is a flow diagram of a thin-film deposition method 900, according to one embodiment. The method 900 can be implemented utilizing systems, components, and processes described in relation to FIGS. 1-8. The method 900 can also be implemented using other systems, components, and processes. At 902, the method 900 includes depositing a thin-film on a patterned wafer in a first chamber. One example of a wafer is the wafer 306 of FIG. 3. One example of a first chamber is the thin-film deposition chamber 302 of FIG. 3. At 903, the method 900 includes transferring the wafer from the first chamber to a second chamber. One example of a second chamber is the thin-film analysis chamber 334 of FIG. 3. At 904, the method 900 includes irradiating, in the second chamber, the thin-film with a laser. One example of a laser is the excitation laser 208 of FIG. 2. At 906, the method 900 includes collecting photoluminescence spectrum data with a light sensor responsive to irradiation with the laser. One example of a light sensor is the light sensor 210 of FIG. 2. At 908, the method 900 includes analyzing the spectrum with an analysis model trained with a machine learning process. One example of an analysis model is the analysis model 314 of FIG. 3. At 910, the method 900 includes determining, with the analysis model, whether there is an oxygen leak based on the spectrum. At 912, the method 900 includes, if there is an oxygen leak, outputting a signal indicating the oxygen leak.

Figure 10:
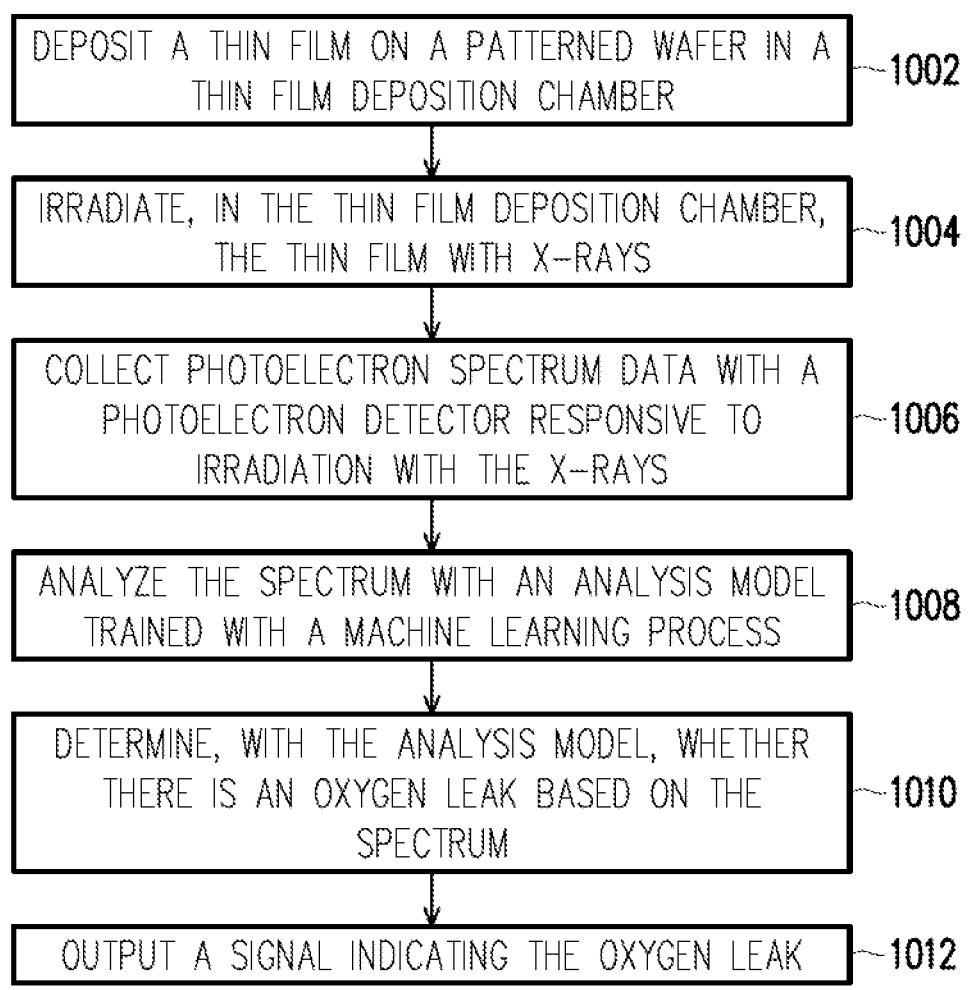

FIG. 10 is a flow diagram of a thin-film deposition method 1000, according to one embodiment. The method 1000 can be implemented utilizing systems, components, and processes described in relation to FIGS. 1-9. The method 1000 can also be implemented using other systems, components, and processes. At 1002, the method 1000 includes depositing a thin-film on a patterned wafer in a thin-film deposition chamber. One example of a wafer is the wafer 106 of FIG. 1. One example of a thin-film deposition chamber is the thin-film deposition chamber 102 of FIG. 1. At 1004, the method 1000 includes irradiating, in the thin-film deposition chamber, the thin-film with x-rays. At 1006, the method 1000 includes collecting photoelectron spectrum data with a photoelectron sensor responsive to irradiation with the x-rays. One example of a photoelectron sensor is the emissions sensor 110 of FIG. 1. At 1008, the method 1000 includes analyzing the spectrum with an analysis model trained with a machine learning process. One example of an analysis model is the analysis model 114 of FIG. 1. At 1010, the method 1000 includes determining, with the analysis model, whether there is an oxygen leak based on the spectrum. At 1012, the method 1000 includes, if there is an oxygen leak, outputting a signal indicating the oxygen leak.

Figure 11:
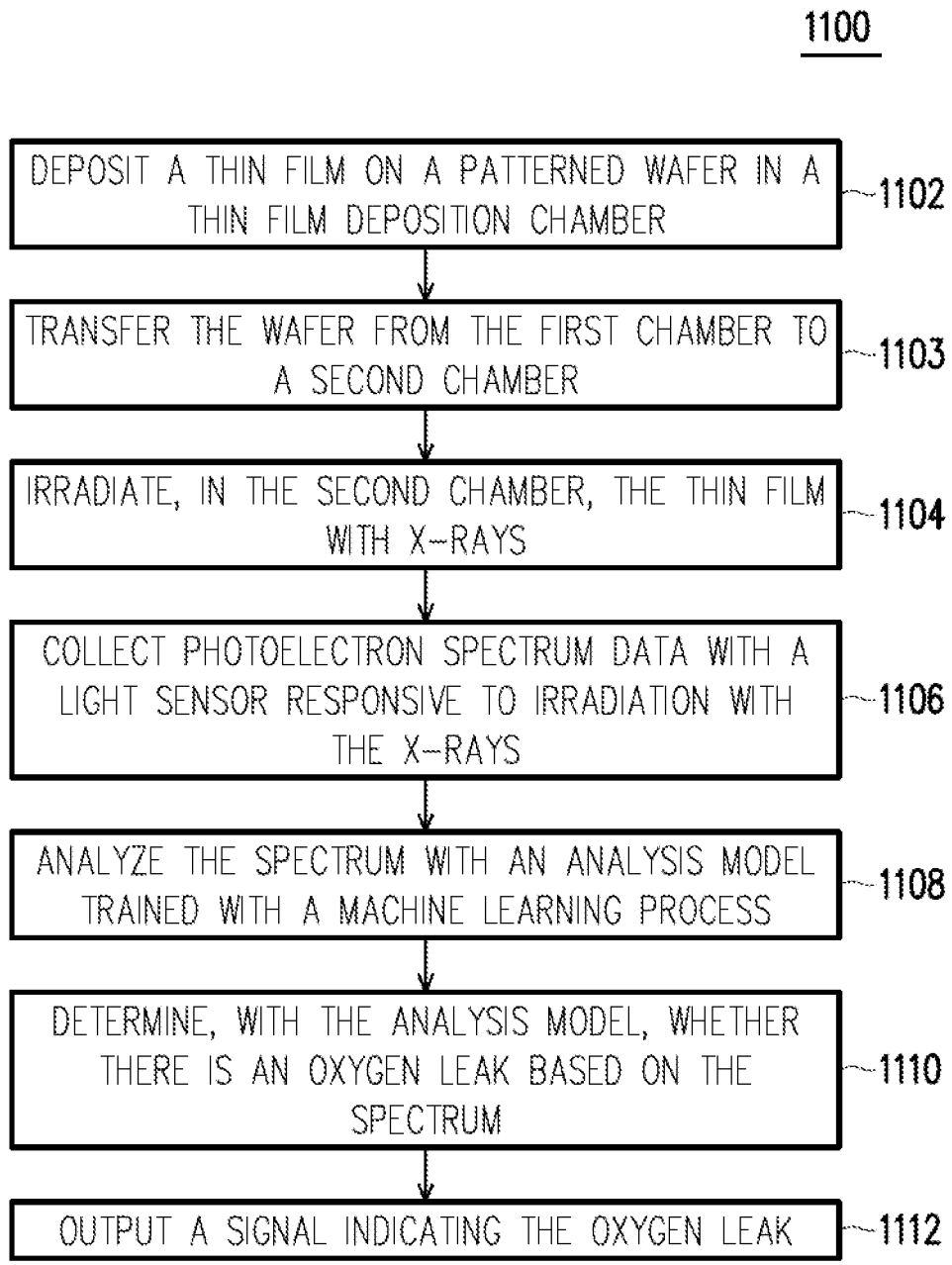

FIG. 11 is a flow diagram of a thin-film deposition method 1100, according to one embodiment. The method 1100 can be implemented utilizing systems, components, and processes described in relation to FIGS. 1-10. The method 1100 can also be implemented using other systems, components, and processes. At 1102, the method 1100 includes depositing a thin-film on a patterned wafer in a first chamber. One example of a wafer is the wafer 306 of FIG. 3. One example of a first chamber is the thin-film deposition chamber 302 of FIG. 3. At 1103, the method 1100 includes transferring the wafer from the first chamber to a second chamber. One example of a second chamber is the thin-film analysis chamber 334 of FIG. 3. At 1104, the method 1100 includes irradiating, in the second chamber, the thin-film with x-rays. At 1106, the method 1100 includes collecting photoelectron spectrum data with a photoelectron sensor responsive to irradiation with the x-rays. One example of a photoelectron sensor is the emissions sensor 310 of FIG. 3. At 1108, the method 1100 includes analyzing the spectrum with an analysis model trained with a machine learning process. One example of an analysis model is the analysis model 314 of FIG. 3. At 1110, the method 1100 includes determining, with the analysis model, whether there is an oxygen leak based on the spectrum. At 1112, the method 1100 includes, if there is an oxygen leak, outputting a signal indicating the oxygen leak.

Figure 12:
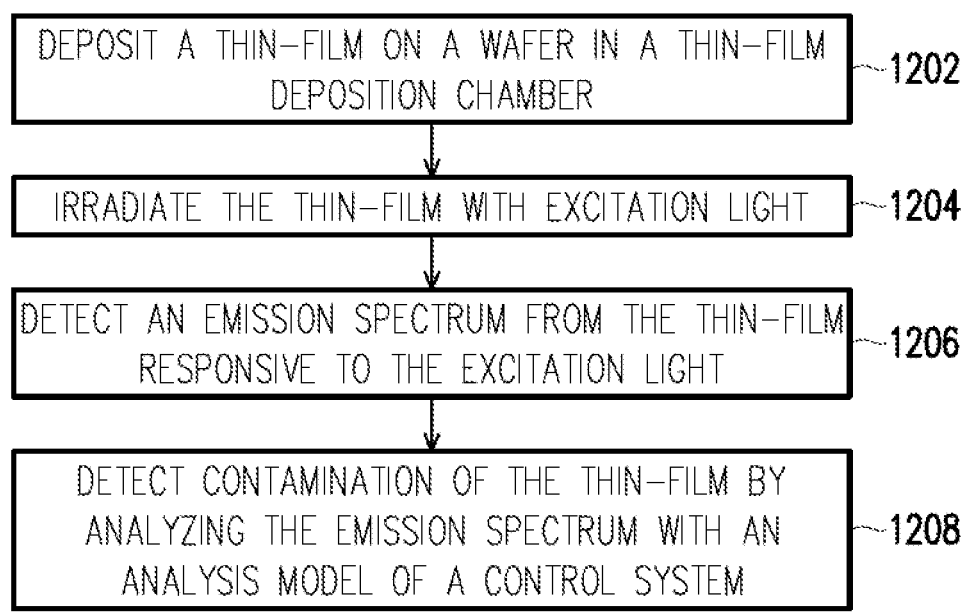

FIG. 12 is a flow diagram of a thin-film deposition method 1200, according to one embodiment. The method 1200 can be implemented utilizing systems, components, and processes described in relation to FIGS. 1-11. The method 1200 can also be implemented using other systems, components, and processes. In one embodiment, at 1202, the method 1200 includes depositing a thin-film on a wafer in a thin-film deposition chamber. One example of thin film deposition chamber is the thin film deposition chamber 102 of FIG. 1. At 1204, the method 1200 includes irradiating the thin-film with excitation light. At 1206, the method 1200 includes detecting an emission spectrum from the thin-film responsive to the excitation light. At 1208, the method 1200 includes detecting contamination of the thin-film by analyzing the emission spectrum with an analysis model of a control system. One example of an analysis model is the analysis model 614 of FIG. 6. One example of a control system is the control system 612 of FIG. 6.

Figure 13:
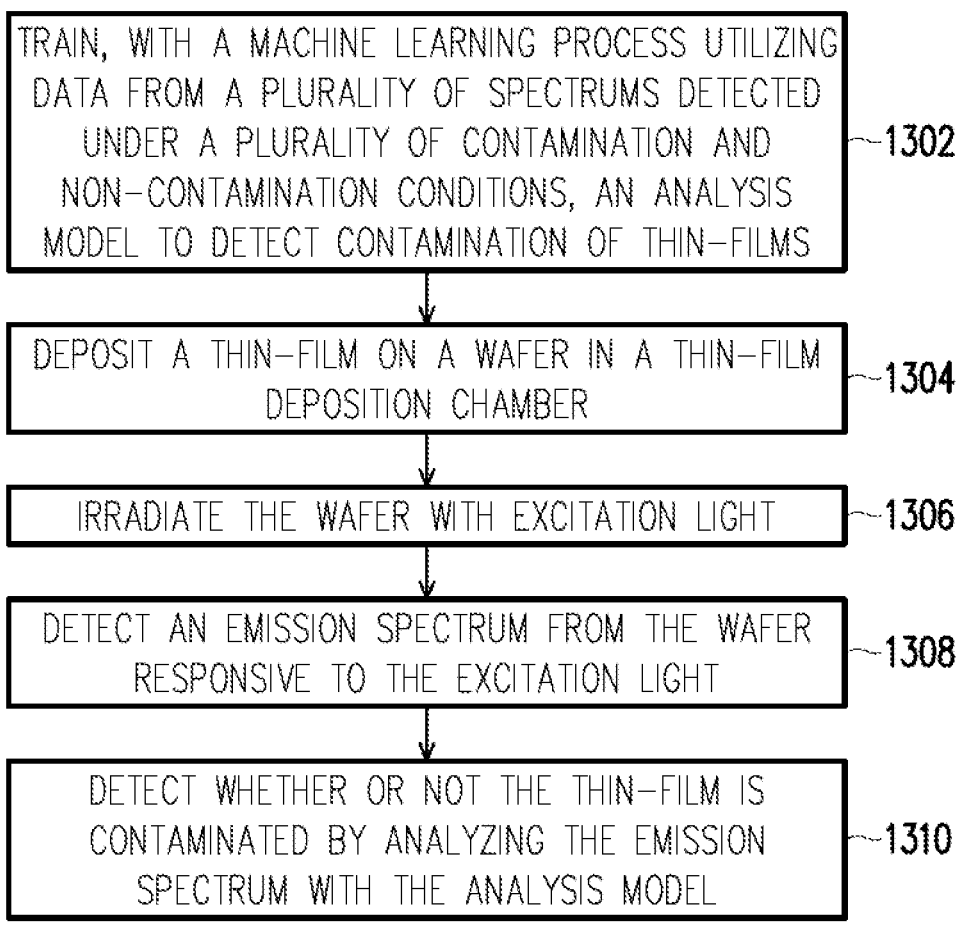

FIG. 13 is a flow diagram of a thin-film deposition method 1300, according to one embodiment. The method 1300 can be implemented utilizing systems, components, and processes described in relation to FIGS. 1-12. The method 1300 can also be implemented using other systems, components, and processes. At 1302, the method 1300 includes training, with a machine learning process utilizing data from a plurality of spectrums detected under a plurality of contamination and non-contamination conditions, an analysis model to detect contamination of thin-films. One example of an analysis model is the analysis model 614 of FIG. 6. At 1304, method 1300 includes depositing a thin-film on a wafer in a thin-film deposition chamber. At 1306, the method 1300 includes irradiating the wafer with excitation light. One example of a thin-film deposition chamber is the thin-film deposition chamber 102 of FIG. 1. At 1308, the method 1300 includes detecting an emission spectrum from the wafer responsive to the excitation light. At 1310, the method 1300 includes detecting whether or not the thin-film is contaminated by analyzing the emission spectrum with the analysis model.

In one embodiment, a method includes depositing a thin-film on a wafer in a thin-film deposition chamber and irradiating the thin-film with excitation light. The method includes detecting an emission spectrum from the thin-film responsive to the excitation light and detecting contamination of the thin-film by analyzing the emission spectrum with an analysis model of a control system.

In one embodiment, a system includes a thin-film deposition chamber configured to deposit a thin-film on a wafer and a radiation source configured to irradiate the thin-film with excitation light. The system includes an emissions sensor configured to detect an emission spectrum from the wafer responsive to the excitation light. The system includes a control system coupled to the radiation source and the emissions sensor and configured to detect contamination of the thin-film by analyzing the spectrum of photons and to stop thin-film deposition processes in the thin-film deposition chamber responsive to detecting contamination of the thin-film.

In one embodiment, a method includes training, with a machine learning process utilizing data from a plurality of spectrums detected under a plurality of contamination and non-contamination conditions, an analysis model to detect contamination of thin-films. The method includes depositing a thin-film on a wafer in a thin-film deposition chamber and irradiating the wafer with excitation light. The method includes detecting an emission spectrum from the wafer responsive to the excitation light and detecting whether or not the thin-film is contaminated by analyzing the emission spectrum with the analysis model.

Embodiments of the present disclosure are able to detect contamination of thin-films in situ. Thin film deposition processes can be stopped upon detection of contamination, thereby reducing the number of wafers with faulty thin-films. This provides many benefits including improved wafer yield and fewer scrapped wafers. Furthermore, oxygen leaks in deposition chambers can be detected based on the detected contamination.

The various embodiments described above can be combined to provide further embodiments. All U.S. patent application publications and U.S. patent applications referred to in this specification and/or listed in the Application Data Sheet are incorporated herein by reference, in their entirety. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A thin-film deposition method, comprising:
   outputting excitation light from a radiation source onto an interior reflective surface of a hollow tube, the radiation source positioned within the tube;
   reflecting, with the interior reflective surface, the excitation light onto a semiconductor wafer outside of and spaced apart from the tube via an interior transparent surface of the tube;
   sensing, with an emission sensor positioned within the tube, an emission spectrum received from the semiconductor wafer into the tube via the interior transparent surface responsive to the excitation light; and
   detecting a contamination of the semiconductor wafer based on the emission spectrum.

2. The method of claim 1, further comprising depositing, in a thin-film deposition chamber, a thin-film on the wafer, wherein detecting contamination of the wafer includes detecting contamination of the thin-film.

3. The method of claim 2, further comprising reflecting the excitation light onto the wafer while the wafer is in the thin-film deposition chamber.

4. The method of claim 2, further comprising:
   transferring the wafer from the thin-film deposition chamber to a detection chamber; and
   reflecting the excitation light onto the wafer while the wafer is in the thin-film deposition chamber.

5. The method of claim 4, further comprising maintaining a vacuum condition of the deposition chamber in the detection chamber while irradiating the thin-film with excitation light.

6. The method of claim 2, wherein detecting contamination includes detecting oxidation of the thin-film.

7. The method of claim 6, further comprising detecting, with a control system, a leak in the deposition chamber based on detecting oxidation of the thin-film.

8. The method of claim 2, further comprising halting operation of the thin-film deposition chamber responsive to detecting contamination of the thin-film.

9. The method of claim 2, wherein the excitation light includes ultraviolet light, wherein detecting the emission spectrum includes detecting a photoluminescence spectrum.

10. The method of claim 2, further comprising:
    training an analysis model with a machine learning process to detect contamination of the thin-film; and
    detecting contamination of the thin-film with the analysis model.

11. The method of claim 1, wherein the excitation light includes X-ray light, wherein detecting the emission spectrum includes detecting a photoelectron spectrum.

12. A thin-film deposition contamination sensing system, comprising:
    a hollow tube including:
        a first interior portion having a reflective surface;
        a second interior portion having a transparent surface;
    a radiation source positioned within the tube and configured to emit an excitation light through the transparent surface by emitting the excitation light onto the reflective surface; and
    an emissions sensor positioned within the tube and positioned to sense an emission spectrum emitted from a thin-film on a semiconductor wafer and received into the tube via the transparent surface.

13. The system of claim 12, wherein the radiation source is a laser, wherein the emissions sensor is an ultraviolet light sensor.

14. The system of claim 12, wherein the radiation source is an x-ray source, wherein the emissions sensor is a photoelectron spectroscopy detector.

15. The system of claim 12, wherein the tube is positioned at least partially within the thin-film deposition chamber.

16. The system of claim 12, wherein the tube is positioned at least partially within a detection chamber in fluid communication with the thin-film deposition chamber.

17. A system, comprising:
    a thin-film deposition chamber configured to deposit a thin-film on a semiconductor wafer;
    a thin-film analysis chamber coupled to the thin film deposition chamber by a transfer channel configured to transfer the wafer from the thin-film deposition chamber to the thin-film analysis chamber and to maintain a vacuum condition of the thin-film deposition chamber within the thin-film analysis chamber;

a radiation source within a hollow tube of the thin-film analysis chamber and configured to irradiate the thin-film with excitation light;

an emissions sensor within the hollow tube of the thin-film analysis chamber and configured to detect an emission spectrum of photons emitted from the wafer responsive to the excitation light; and a control system configured to determine that a thin film of the wafer is contaminated based on a presence of a photon frequency corresponding to an energy difference between two electron energy levels of an expected contamination material of the thin film.

18. The system of claim 17, wherein the hollow tube includes:

an interior reflective portion configured to reflect the excitation light within the tube; and an interior transparent portion configured to allow the excitation light to exit the tube and to allow the excitation light reflected from the thin-film to enter the tube.

19. The system of claim 17, wherein the control system includes an analysis model trained with a machine learning process to detect contamination of thin-film based on the emission spectrum.

20. The system of claim 19, wherein the analysis model includes a neural network.

\* \* \* \* \*